(12) United States Patent
Sriadibhatla

(10) Patent No.: US 8,736,332 B2
(45) Date of Patent: May 27, 2014

(54) LEAKAGE CURRENT REDUCTION IN A SEQUENTIAL CIRCUIT

(75) Inventor: Srinivas Sriadibhatla, Bangalore (IN)

(73) Assignee: LSI Corporation, San Jose, CA (US)

( * ) Notice: Subject to any disclaimer, the term of this patent is extended or adjusted under 35 U.S.C. 154(b) by 255 days.

(21) Appl. No.: 12/640,004

(22) Filed: Dec. 17, 2009

(65) Prior Publication Data

US 2011/0148496 A1 Jun. 23, 2011

(51) Int. Cl.
*H03K 3/00* (2006.01)
*H03K 3/012* (2006.01)

(52) U.S. Cl.
CPC ..................................... *H03K 3/012* (2013.01)
USPC ......................................................... 327/199

(58) Field of Classification Search
CPC ... H03K 19/0016; G06F 1/3203; G11C 5/147
USPC ................. 327/199–203, 208, 210–212, 215, 327/217–219, 544; 326/40, 46
See application file for complete search history.

(56) References Cited

U.S. PATENT DOCUMENTS

| | | | |
|---|---|---|---|
| 6,066,866 A * | 5/2000 | Omori ........................... 257/202 |
| 6,107,700 A | 8/2000 | Ishikawa | |
| 6,169,419 B1 | 1/2001 | De et al. | |
| 6,191,606 B1 | 2/2001 | Ye | |
| 7,096,374 B2 | 8/2006 | Srikantam et al. | |
| 7,302,652 B2 | 11/2007 | Chen et al. | |
| 7,305,335 B2 * | 12/2007 | Warren ........................... 703/18 |
| 7,735,045 B1 * | 6/2010 | Van Mau et al. .............. 716/128 |
| 2004/0194037 A1 | 9/2004 | Chen | |
| 2005/0168242 A1 | 8/2005 | Won | |
| 2007/0168792 A1 | 7/2007 | Barowski et al. | |
| 2009/0051388 A1 | 2/2009 | Flynn | |
| 2009/0172615 A1 | 7/2009 | Ortiz et al. | |

OTHER PUBLICATIONS

Decision of Rejection; Received Feb. 21, 2013 for the corresponding CN Application No. 201010109303.9.

* cited by examiner

*Primary Examiner* — Sibin Chen
(74) *Attorney, Agent, or Firm* — Mendelsohn, Drucker & Dunleavy, P.C.; Steve Mendelsohn

(57) ABSTRACT

A system and device for reducing leakage current in a sequential circuit is disclosed. In one embodiment, a system for reducing leakage current in a sequential circuit includes a combinational logic circuit, one or more reset flip-flops coupled to the combinational logic circuit, and one or more set-reset flip-flops coupled to the combinational logic circuit. The system further includes a control module coupled to the reset flip-flops and to the set flip-flops and configured to reset the reset flip-flops and to set the set-reset flip-flops when a standby mode of the sequential circuit is triggered.

16 Claims, 4 Drawing Sheets

| SIGNAL 252 / OPERATIONAL MODE 254 | SLEEP SIGNAL 220 | SET SIGNAL 218 | RESET SIGNAL 226 |
|---|---|---|---|
| STANDBY MODE 256 | 0 | X | X |
| ACTIVE MODE 258 | 1 | X | X |

US 8,736,332 B2

LEAKAGE CURRENT REDUCTION IN A SEQUENTIAL CIRCUIT

FIELD OF TECHNOLOGY

Embodiments of the present invention relate to the field of electronics. More particularly, embodiments of the present invention relate to power management of electronic devices and systems.

BACKGROUND

Leakage current may be a small current leaking from a device in its off state, caused by semiconductor characteristics of the device. For example, high leakage current in deep-submicrometer regimes is becoming a significant contributor to power dissipation of complementary metal-oxide-semiconductor (CMOS) circuits in the device as the threshold voltage, channel length, and gate oxide thickness of transistors making up the CMOS circuits are continually being reduced due to ongoing efforts to scale down the device.

There may be three major sources of leakage in a device, namely subthreshold leakage, gate leakage, and reverse bias junction leakage. The subthreshold leakage may be caused by current flowing from the drain to the source of a transistor operating in a weak inversion region. The gate leakage may be caused by current flowing from the gate through the oxide to the substrate of the transistor due to the gate oxide tunneling and hot carrier injection. The reverse bias junction leakage may be caused by current flowing from the source or drain to the substrate of the transistor through the reverse-biased diodes. With scaling down of the transistor, each of the leakage sources may increase accordingly, thus resulting in the increase of the total leakage current.

The size of leakage current in a circuit may depend on the input vectors applied to its primary inputs. Further, the leakage current ratio between different input combinations to logic gates of the circuit can be as high as 10. An input vector control method is a technique to reduce the leakage current. For example, during the design of a sequential circuit, which includes multiple stages of flip-flops connected to a combinational logic circuit, minimum leakage bits (MLBs) for reducing leakage current or leakage power consumption for the combinational logic circuit may be calculated during the design stage of the sequential circuit and implemented during the fabrication stage of the sequential circuit. The MLBs then may be applied to the combinational logic circuit during the standby mode of the sequential circuit to reduce the leakage current.

The implementation may be brought about by adding multiplexers to the sequential circuit so that inputs to the flip-flops may be fed to the combinational logic circuit during the active mode of the sequential circuit. Conversely, the MLBs may be fed to the combinational logic circuit using the multiplexers during the standby mode of the sequential circuit. Although the leakage current via the combinational logic circuit may be reduced according to this method, the addition of the multiplexers may eat up a significant real estate of a device using the sequential circuit and/or cause considerable timing overhead. Alternatively, memory may be implemented to the device to store the MLBs so that the MLBs may be available for the combinational logic circuit during the standby mode. Although this method may be more effective in terms of reducing the area overhead than the method employing the multiplexers, the memory may consume considerable power holding and moving the MLBs to the combinational logic circuit.

SUMMARY

A system for reducing leakage current in a sequential circuit is disclosed. According to an aspect of the present invention, the system includes a combinational logic circuit, one or more reset flip-flops coupled to the combinational logic circuit, and one or more set-reset flip-flops coupled to the combinational logic circuit. The system further includes a control module coupled to the reset flip-flops and to the set flip-flops and configured to reset the reset flip-flops and to set the set-reset flip-flops when a standby mode of the sequential circuit is triggered.

According to another aspect of the present invention, a sequential circuit includes multiple combinational logic circuits, one or more reset flip-flops coupled to each one of the combinational logic circuits, and one or more set-reset flip-flops coupled to each one of the combinational logic circuits. The sequential circuit also includes a control module coupled to the reset flip-flops and to the set-reset flip-flops and configured to reset the reset flip-flops and to set the set-reset flip-flops when a standby mode of the sequential circuit is triggered.

According to yet another aspect of the present invention, a device includes a sequential circuit which includes multiple combinational logic circuits, one or more reset flip-flops coupled to each one of the combinational logic circuits, and one or more set-reset flip-flops coupled to each one of the combinational logic circuits. The sequential circuit also includes a control module coupled to the reset flip-flops and to the set-reset flip-flops and configured to reset the reset flip-flops and to set the set-reset flip-flops when a standby mode of the sequential circuit is triggered. The device further includes a power management unit coupled to the control module to forward a sleep signal when the standby mode of the sequential circuit is triggered.

The systems and devices disclosed herein may be implemented in any means for achieving various aspects, and other features will be apparent from the accompanying drawings and from the detailed description that follow.

BRIEF DESCRIPTION OF THE DRAWINGS

Various preferred embodiments are described herein with reference to the drawings, wherein.

The drawings described herein are for illustration purposes only and are not intended to limit the scope of the present disclosure in any way.

DETAILED DESCRIPTION

Systems and devices for reducing leakage current in a sequential circuit are disclosed. In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
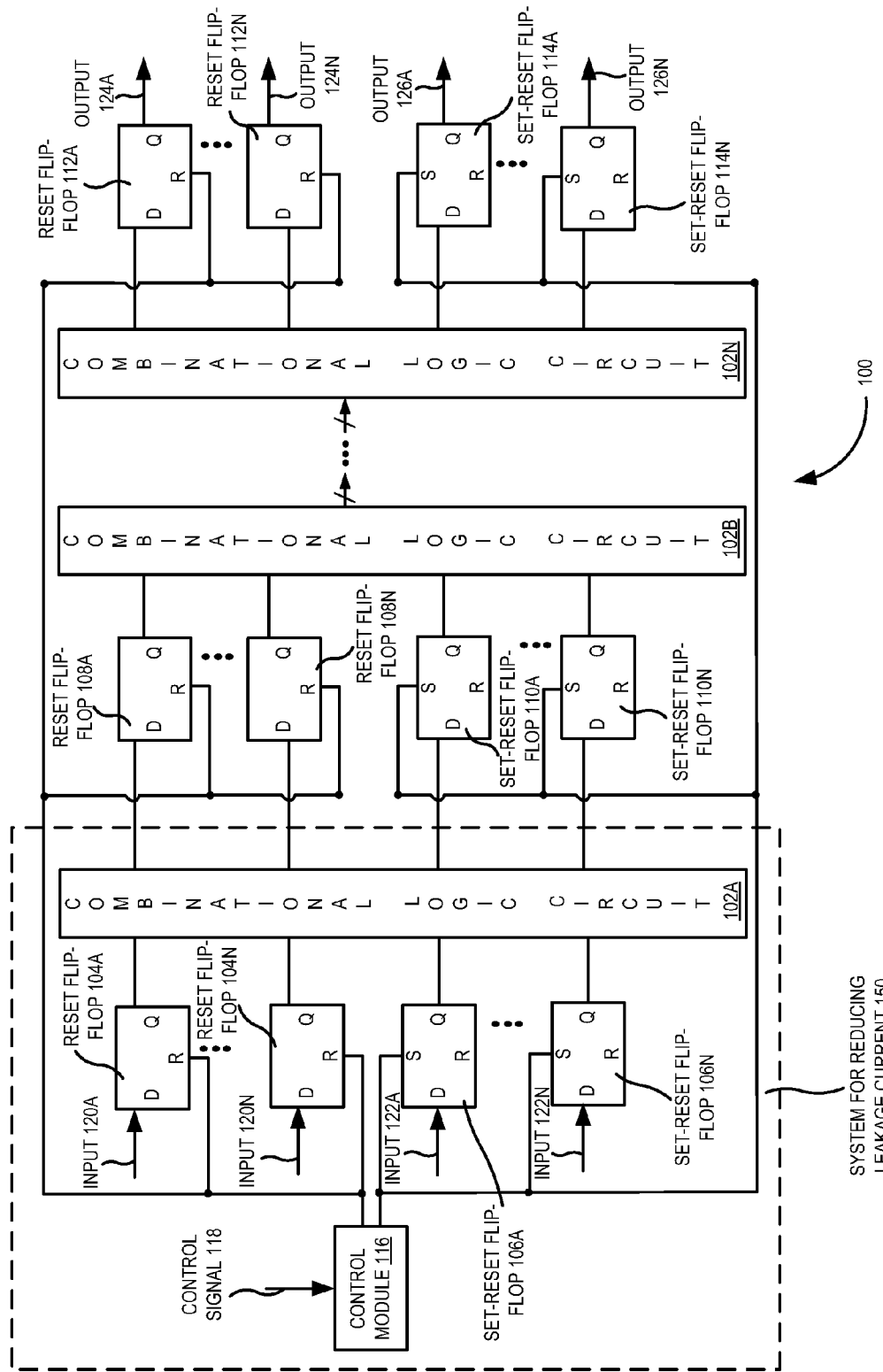
FIG. 1 illustrates an exemplary sequential circuit with a system for reducing leakage current, according to one embodiment.

FIG. 1 illustrates an exemplary sequential circuit 100 with a system for reducing leakage current 150, according to one embodiment. In particular, FIG. 1 illustrates a pipeline type of sequential circuit. The sequential circuit 100 includes a plurality of combinational logic circuits 102A-N, a plurality of reset flip-flops 104A-N, 108A-N and 112A-N, and a plurality of set-reset flip-flops 106A-N, 110A-N and 114A-N. The sequential circuit 100 also includes a control module 116.

The combinational logic circuits 102A-N may be circuits formed by combining a plurality of logic gates (e.g., AND, OR, NAND, NOR and the like) and are configured to perform a Boolean algebra on inputs 120A-N and 122A-N received from the flip-flops coupled to the combinational logic circuits 102A-N. In one example implementation, the reset flip-flops 104A-N, 108A-N and 112A-N and the set-reset flip-flops 106A-N, 110A-N and 114A-N may be D-type flip-flops. Further, the reset flip-flops 104A-N, 108A-N and 112A-N and the set-reset flip-flops 106A-N, 110A-N and 114A-N may be asynchronous or synchronous in type.

As shown, the reset flip-flops 104A-N and the set-reset flip-flops 106A-N are coupled to the combinational logic circuit 102A. Further, the reset flip-flops 108A-N and the set-reset flip-flops 110A-N are coupled to the combinational logic circuit 102A and the combinational logic circuit 102B. It can be noted that, two adjacent combinational logic circuits in the sequential circuit 100 are connected through reset flip-flops and set-reset flip-flops. Further, as shown, the combinational logic circuit 102N is coupled to the reset flip-flops 112A-N and the set-reset flip-flops 114A-N.

The control module 116 is coupled to the reset flip-flops 104A-N, 108A-N and 112A-N and the set-reset flip-flops 106A-N, 110A-N and 114A-N. In one example embodiment, the control module 116 includes an OR gate coupled to the reset flip-flops 104A-N, 108A-N and 112A-N and an AND gate coupled to the set-reset flip-flops 104A-N, 108A-N and 112A-N. It can be seen from FIG. 1 that the control module 116, the reset flip-flops 104A-N, the set-reset flip-flops 106A-N and the combinational logic circuit 102A form the system for reducing leakage current 150. It is appreciated that the sequential circuit 100 may include the control module 116 and multiple stages of input flip-flops coupled to a combinational logic circuit.

During the active mode of the sequential circuit 100, inputs 120A-N are fed to the reset flip-flops 104A-N, respectively. Also, inputs 122A-N are fed to the set-reset flip-flops 106A-N, respectively. Using the inputs 120A-N and 122A-N, the reset flip-flops 104A-N and the set-reset flip-flops 106A-N drive the combinational logic circuit 102A. The outputs of the combinational logic circuit 102A are stored or held in the reset flip-flops 108A-N and the set-reset flip-flops 110A-N to drive the combinational logic circuit 102B. After having gone through several stages of the flip-flop and combinational logic circuit combinations, outputs 124A-N and 126A-N are generated.

When a standby or sleep mode of the sequential circuit 100 (e.g., or a device comprising the sequential circuit 100) is triggered (e.g., upon receiving a control signal 118), the control module 116 is configured to reset the reset flip-flops 104A-N, 108A-N and 112A-N and to set the set-reset flip-flops 106A-N, 110A-N and 114A-N. The control signal 118 (e.g., an active low sleep signal) may be received and processed by the control module 116 when the standby or sleep mode of the sequential circuit 100 is triggered. When the sequential circuit 100 becomes active again, the control module 116 is transparent and passes the reset and set signals to the flip-flops.

According to an embodiment of the present invention, the following process may be used during the design of the sequential circuit 100. For designing the sequential circuit 100, a synthesized, mapped and timing closed netlist is taken as an input from a logic synthesis tool. For all the combinational logic circuits 102A-N, Then, reset pins of reset flip-flops (e.g., the reset flip-flops 104A-N, 108A-N and 112A-N) with MLB of logical value '0' are logically connected to an active low sleep signal. It can be noted that, connection of the reset pins of the set-reset flip-flops 106A-N, 110A-N and 114A-N remains unchanged. In other words, the reset pins of the set-reset flip-flops 106A-N, 110A-N and 114A-N are connected to a reset signal. Further, set pins of the set-reset flip-flops 106A-N, 110A-N and 114A-N are tied together such that, an inverted sleep signal can be fed to the set pins when the sequential circuit 100 enters the standby mode.

Then, a static timing analysis (STA) is performed on the modified netlist. It can be noted that, in case of any violations caused by insertion of the set-reset flip-flops 106A-N, 110A-N and 114A-N, then the set-reset flip-flops 106A-N, 110A-N and 114A-N are replaced by equivalent reset flip-flops. Upon performing the STA, the modified netlist is fed to a physical design tool for completing the design of the sequential circuit 100. Finally, the sequential circuit 100 as shown in FIG. 1 is obtained.

Figures 2A, 2B:
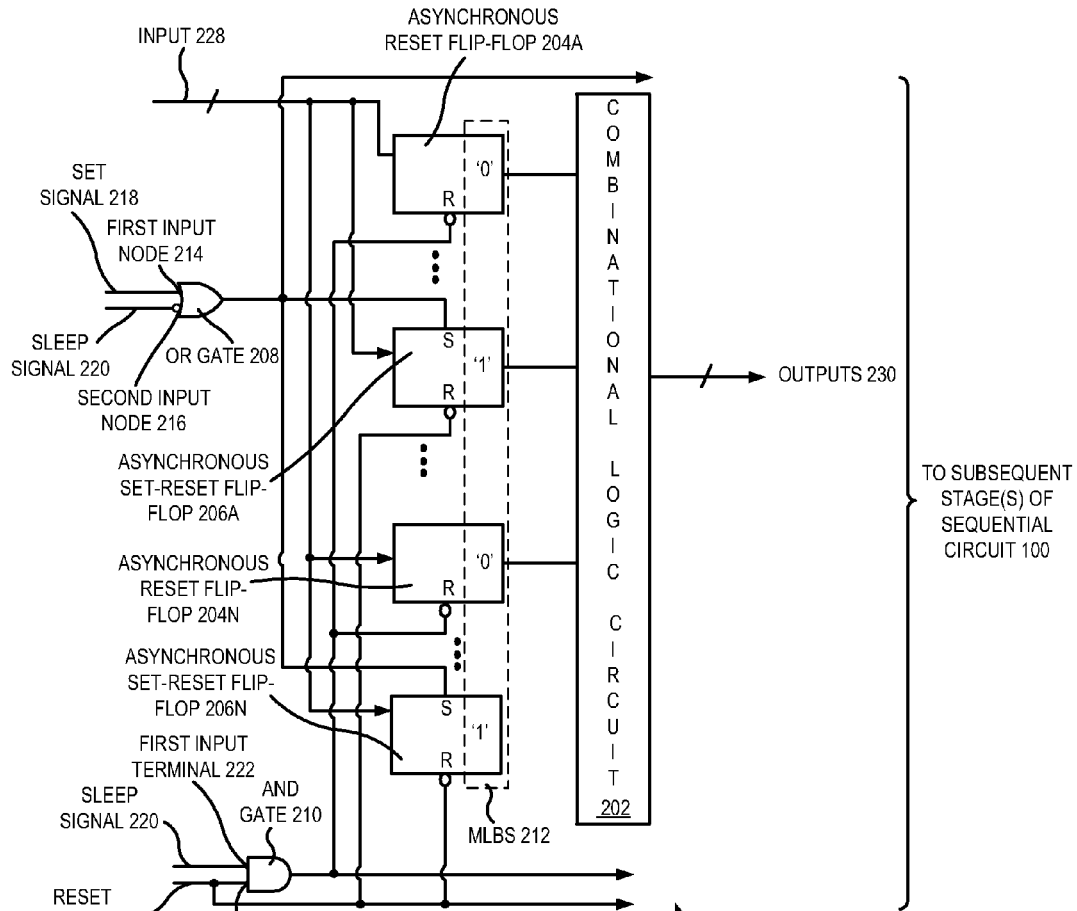
FIG. 2A illustrates an exemplary circuit of the system in FIG. 1, according to one embodiment.
FIG. 2B illustrates an exemplary table illustrating operation of the circuit in FIG. 2A, according to one embodiment.

FIG. 2A illustrates an exemplary circuit 200 of the system 150 in FIG. 1, according to one embodiment. As shown, the circuit 200 includes a combinational logic circuit 202, asynchronous reset flip-flops 204A-N and asynchronous set-reset flip-flops 206A-N. The circuit 200 also includes an OR gate 208 and an AND gate 210. It is appreciated that, the OR gate 208 and the AND gate 210 together constitute the control module 116 of FIG. 1.

In FIG. 2A, the asynchronous reset flip-flops 204A-N and the asynchronous set-reset flip-flops 206A-N are coupled to the combinational logic circuit 202. The output of the OR gate 208 is coupled to the asynchronous set-reset flip-flops 206A-N. Further, the OR gate 208 includes a first input node 214 and a second input node 216, where the first input node 214 is configured to receive a set signal 218 and the second input node 216 is configured to receive a sleep signal 220. The output of the AND gate 210 is coupled to the asynchronous reset flip-flops 204A-N. Further, the AND gate 210 includes a first input terminal 222 and a second input terminal 224, where the first input terminal 222 is configured to receive the sleep signal 220 and the second input terminal 224 is configured to receive a reset signal 226.

As shown, the asynchronous reset flip-flops 204A-N and the asynchronous set-reset flip-flops 206A-N are configured to receive inputs 228. During the active mode, the asynchronous reset flip-flops 204A-N and the asynchronous set-reset flip-flops 206A-N feed the inputs 228 to the combinational logic circuit 202 for generating outputs 230. The outputs 230 are then fed as inputs to subsequent stages of the sequential FIG. 2B illustrates an exemplary table 250 illustrating operation of the circuit 200 in FIG. 2A, according to one embodiment. The table 250 illustrates three types of signal 252 and two types of operational mode 254. As illustrated in the table 250, when the circuit 200 is triggered to enter into a standby mode 256, the OR gate 208 is configured to invert and process an active low sleep signal (e.g., of logical value '0') via the second input node 216. Accordingly, the OR gate 208 sets the asynchronous set-reset flip-flops 206A-N. As a result, the asynchronous set-reset flip-flops 206A-N feed the minimum leakage bits 212 (e.g., of value 1) to the combinational logic circuit 202 such that the leakage current via the combinational logic circuit 202 is minimum.

Also, the AND gate 210 is configured to process the active low sleep signal 220 (e.g., of logical value '0') via the first input terminal 222 to reset the asynchronous reset flip-flops 204A-N. This causes the asynchronous reset flip-flops 204A-N feed the minimum leakage bits 212 (e.g., of value 0) to the combinational logic circuit 202 such that the leakage current via the combinational logic circuit 202 is minimum.

When an active mode 258 is triggered, the OR gate 208 is configured to process a set signal 218 via the first input node 214 and process a high sleep signal 220 (e.g., of logical value '1') via the second input node 216. Accordingly, the OR gate 208 passes the set signal 218 to the asynchronous set-reset flip-flops 206A-N. Also, the AND gate 210 is configured to process a high sleep signal 220 (e.g., of logical value '1') via the first input terminal 222 and processes a reset signal 226 via the second input terminal 224. Accordingly, the AND gate 210 passes the reset signal 226 to the asynchronous reset flip-flops 204A-N. That is, the control module, which includes the OR gate 208 and the AND gate 210, becomes transparent during the active mode 258 since it passes on the set signal 218 and the reset signal 226 to the flip-flops. Thus, when the active mode 258 of the circuit 200 is triggered and there is no set signal 218 and reset signal 226 present, the asynchronous reset flip-flops 204A-N and the asynchronous set-reset flip-flops 206A-N feed the inputs 228 to the combinational logic circuit 202. As a result, the combinational logic circuit 202 generates outputs 230 to be provided to the subsequent stage(s) of the sequential circuit 100.

Figures 3A, 3B:
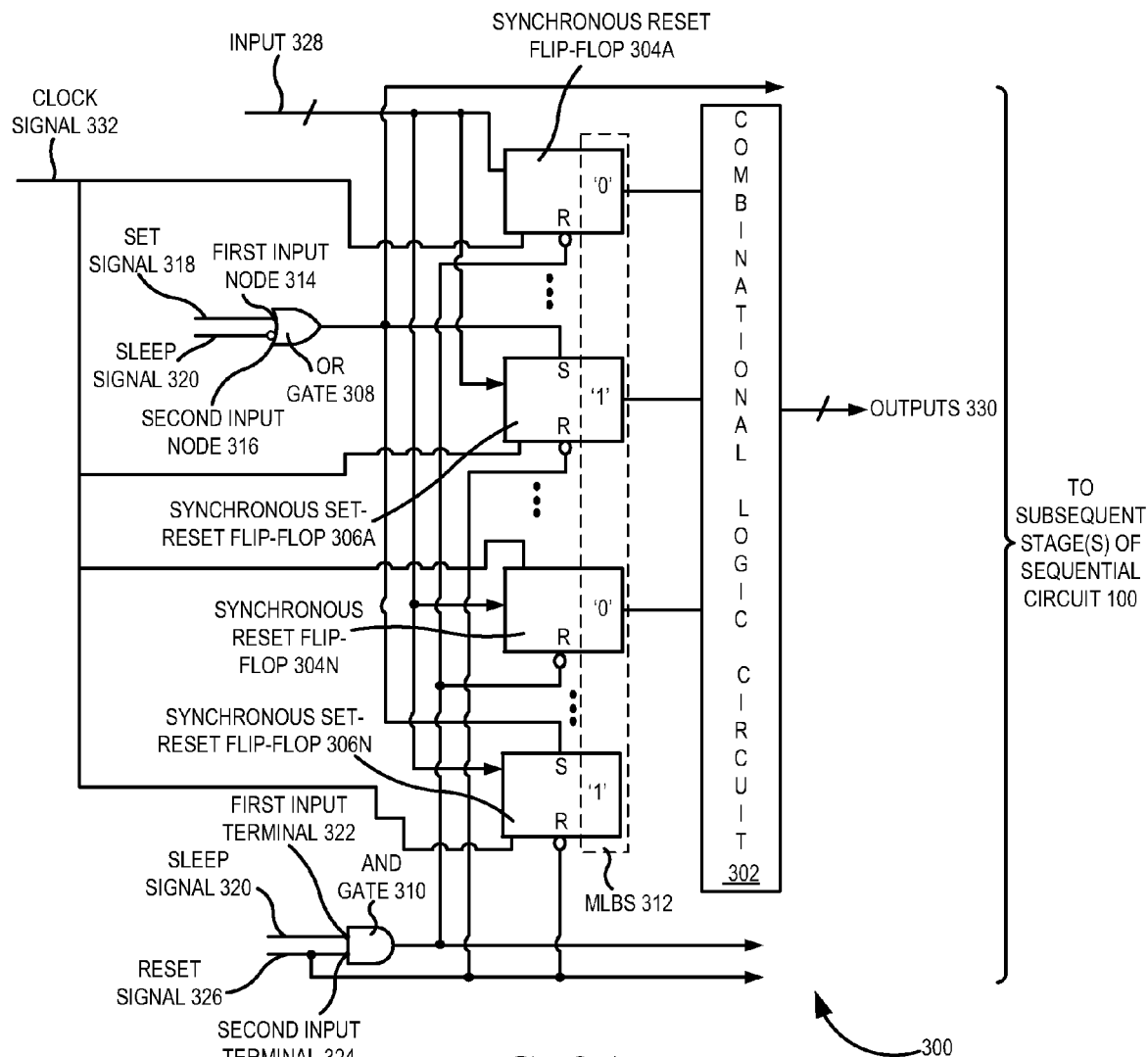
FIG. 3A illustrates another exemplary circuit of the system in FIG. 1, according to one embodiment.
FIG. 3B illustrates an exemplary table illustrating operation of the circuit in FIG. 3A, according to one embodiment.

FIG. 3A illustrates an exemplary circuit 300 of the system 150 in FIG. 1, according to one embodiment. As shown, the circuit 300 includes a combinational logic circuit 302, synchronous reset flip-flops 304A-N and synchronous set-reset flip-flops 306A-N, with clock signal 332. The circuit 300 also includes an OR gate 308 and an AND gate 310. It is appreciated that, the OR gate 308 and the AND gate 310 together constitute the control module 116 of FIG. 1.

In FIG. 3A, the synchronous reset flip-flops 304A-N and the synchronous set-reset flip-flops 306A-N are coupled to the combinational logic circuit 302. The output of the OR gate 308 is coupled to the synchronous set-reset flip-flops 306A-N. Further, the OR gate 308 includes a first input node 314 and a second input node 316, where the first input node 314 is configured to receive a set signal 318 and the second input node 316 is configured to receive a sleep signal 320. The output of the AND gate 310 is coupled to the synchronous reset flip-flops 304A-N. Further, the AND gate 310 includes a first input terminal 322 and a second input terminal 324, where the first input terminal 322 is configured to receive the sleep signal 320 and the second input terminal 324 is configured to receive a reset signal 326.

As shown, the synchronous reset flip-flops 304A-N and the synchronous set-reset flip-flops 306A-N are configured to receive inputs 328. During an active mode, the synchronous reset flip-flops 304A-N and the synchronous set-reset flip-flops 306A-N feed the inputs 328 to the combinational logic circuit 302 for generating outputs 330. The outputs 330 are then fed as inputs to subsequent stages of the sequential circuit 100. When a standby mode is triggered, the synchronous reset flip-flops 304A-N and the synchronous set-reset flip-flops 306A-N feed minimum leakage bits 312 (e.g., 0 or 1) to the combinational logic circuit 302. It is appreciated that, the minimum leakage bits 312 are obtained using an input vector control method. It is also appreciated that, the minimum leakage bits 312 are used to provide a minimum leakage current via the combinational logic circuit 302 during the standby mode of operation.

FIG. 3B illustrates an exemplary table 350 illustrating operation of the circuit 300 in FIG. 3A, according to one embodiment. The table 350 illustrates three types of signal 352 and two types of operational mode 354. The operation of the circuit 300 during a standby mode 356 and an active mode 358 of the circuit 300 as illustrated in the table 350 is same as operation of the circuit 200 illustrated in the table 250, hence the description thereof is omitted.

Figure 4:
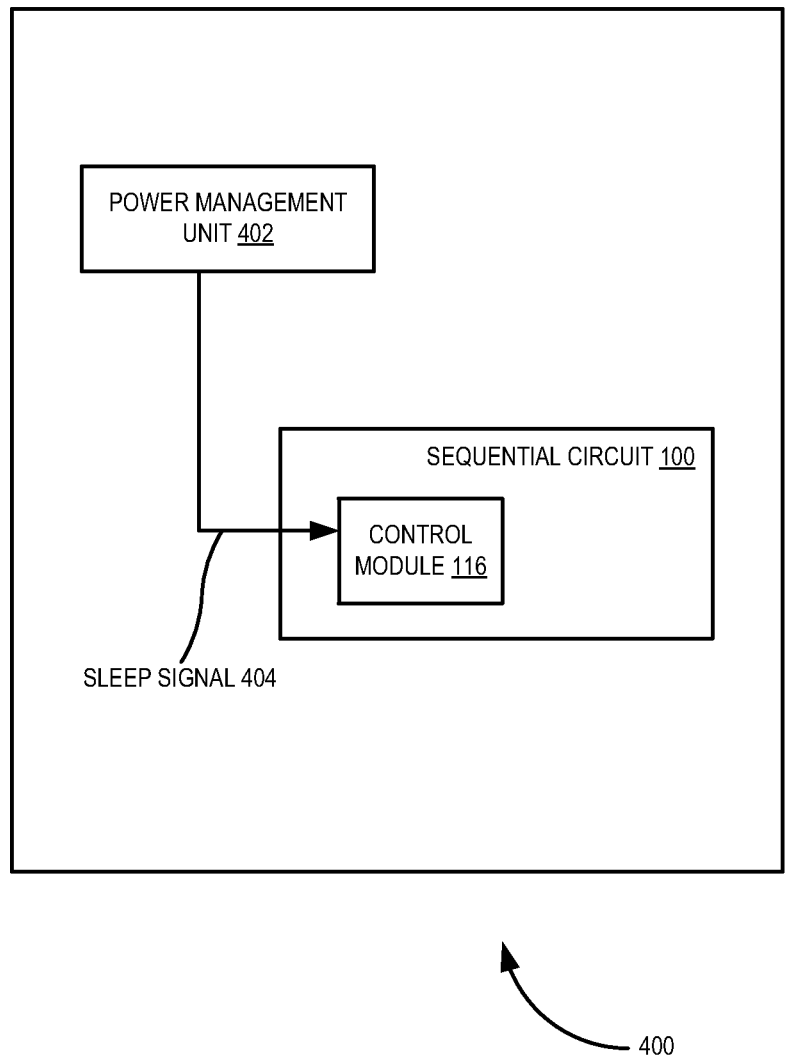
FIG. 4 illustrates an exemplary device with the sequential circuit of FIG. 1, according to one embodiment.

FIG. 4 illustrates an exemplary device 400 with the sequential circuit 100 of FIG. 1, according to one embodiment. The device 400 as illustrated in FIG. 4 may be any electronic device such as laptop, mobile device, workstation, server, desktop and the like, employing the sequential circuit 100. As shown, the device 400 includes a sequential circuit 100 with the control module 116 (e.g., as shown in FIG. 1) and a power management unit 402. The power management unit 402 is coupled to the control module 116. In one exemplary implementation, the power management unit 402 generates a sleep signal 404 (e.g., an active low sleep signal) when a standby mode of the device 400 is triggered. Further, the power management unit 402 forwards the sleep signal 404 to the control module 116. As described above, the control module 116 resets the reset flip-flops 104A-N, 108A-N and 112A-N and sets the set-reset flip-flops 106A-N, 110A-N and 114A-N upon receiving the sleep signal 404 such that leakage current via the combinational logic circuits 102A-N is minimum.

In various embodiments, the systems and devices described in FIGS. 1-4 may help reduce leakage current in a sequential circuit by implementing reset and set-reset flip-flops as based on the MLBs without employing a significant number of additional components (e.g., multiplexers, logic gates, etc.) in the sequential circuit. Also, the systems and devices may eliminate the need to store MLBs in memory. Further, the systems and devices may allow cutting off the clock immediately after the sequential circuit enters the standby mode, thus saving significant amount of dynamic power.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., complementary metal-oxide-semiconductor (CMOS) based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated circuit (ASIC)).

What is claimed is:

1. A device comprising a sequential circuit having an active mode and a standby mode, the sequential circuit comprising:
   a first combinational logic circuit;
   a first set of one or more reset flip-flops, each reset flip-flop having (i) a data input port, (ii) a reset port, and (iii) a data output port coupled to a corresponding data input port of the first combinational logic circuit;

a first set of one or more set-reset flip-flops, each set-reset flip-flop having (i) a data input port, (ii) a set port, (iii) a reset port, and (iv) a data output port coupled to a corresponding data input port of the first combinational logic circuit, wherein the first combinational logic circuit provides reduced leakage current when (i) each reset flip-flop provides a data value of 0 and (ii) each set-reset flip-flop provides a data value of 1 to the corresponding data input ports of the first combinational logic circuit; and a control module coupled to the one or more reset flip-flops and to the one or more set-reset flip-flops, wherein the control module is configured to:

apply active-mode data values presented at the data input ports of (i) the one or more reset flip-flops and (ii) the one or more set-reset flip-flops to the corresponding data input ports of the first combinational logic circuit during the active mode of the sequential circuit; and (i) reset the one or more reset flip-flops such that the data output port of each reset flip-flop applies a data value of 0 to the corresponding data input port of the first combinational logic circuit and (ii) set the one or more set-reset flip-flops such that the data output port of each set-reset flip-flop applies a data value of 1 to the corresponding data input port of the first combinational logic circuit during the standby mode of the sequential circuit to configure the first combinational logic circuit to provide the reduced leakage current.

2. The device of claim 1, wherein the one or more reset flip-flops comprise at least one asynchronous reset flip-flop, and wherein the one or more set-reset flip-flops comprise at least one asynchronous set-reset flip-flop.

3. The device of claim 1, wherein the one or more reset flip-flops comprise at least one synchronous reset flip-flop, and wherein the one or more set-reset flip-flops comprise at least one synchronous set-reset flip-flop.

4. The device of claim 1, wherein each reset flip-flop and each set-reset flip-flop is based on a D-type flip-flop.

5. The device of claim 1, further comprising a power management unit coupled to the control module to forward a sleep signal when the standby mode of the sequential circuit is triggered.

6. The device of claim 1, wherein the one or more reset flip-flops and the one or more set-reset flip-flops are configured to feed minimum leakage bits for the first combinational logic circuit during the standby mode.

7. The device of claim 6, wherein the minimum leakage bits are used to provide minimum leakage current via the first combinational logic circuit.

8. The device of claim 6, wherein the minimum leakage bits are obtained using an input vector control method.

9. The device of claim 1, wherein the control module comprises:

an OR gate coupled to (i) receive an active-mode set signal and a sleep signal and (ii) provide an OR-gate output signal to the set port of each set-reset flip-flop, such that, when the sleep signal indicates that the sequential circuit is in the standby mode, the OR-gate output signal ensures that each set-reset flip-flop applies a data value of 1 to the corresponding data input port of the first combinational logic circuit; and an AND gate coupled (i) receive an active-mode reset signal and the sleep signal and (ii) provide an AND-gate output signal to the reset port of each reset flip-flop, such that, when the sleep signal indicates that the sequential circuit is in the standby mode, the AND-gate output signal ensures that each reset flip-flop applies a data value of 0 to the corresponding data input port of the first combinational logic circuit.

10. The device of claim 9, wherein:
the sleep signal is an active low signal; and
the OR gate is configured to set each set-reset flip-flop based on the active low sleep signal received when the standby mode of the sequential circuit is triggered.

11. The device of claim 10, wherein the OR gate comprises a first input node and a second input node, and wherein the OR gate is configured to invert and process the active low sleep signal via the second input node.

12. The device of claim 11, wherein the OR gate is configured to invert and process a high sleep signal via the second input node when the active mode of the sequential circuit is triggered.

13. The device of claim 9, wherein:
the sleep signal is an active low signal; and
the AND gate is configured to reset each reset flip-flop based on the active low sleep signal received when the standby mode of the sequential circuit is triggered.

14. The device of claim 13, wherein the AND gate comprises a first input terminal and a second input terminal, and wherein the AND gate is configured to process the active low sleep signal via the first terminal.

15. The device of claim 14, wherein the AND gate is configured to process a high sleep signal via the first input terminal when the active mode of the sequential circuit is triggered.

16. The device of claim 1, wherein the sequential circuit further comprises one or more other combinational logic circuits, one or more other sets of one or more reset flip-flops, and one or more other sets of set-reset flip-flops, sequentially configured with the first combinational logic circuit, the first set of one or more reset flip-flops, and the first set of one or more set-reset flip-flops, wherein:

each other set of one or more reset flip-flops and each other set of one or more set-reset flip-flops are configured to a corresponding other combinational logic circuit and to the control module in a manner analogous to how the first set of one or more reset flip-flops and the first set of one or more set-reset flip-flops are configured to the first combinational logic circuit and to the control module.

* * * * *